(12) United States Patent
Walker et al.

(10) Patent No.: US 11,536,756 B2
(45) Date of Patent: Dec. 27, 2022

(54) PHASED ARRAY WIRELESS POWER DELIVERY OPTMIZATION

(71) Applicant: California Institute of Technology, Pasadena, CA (US)

(72) Inventors: Christopher I. Walker, Berkeley, CA (US); Seyed Ali Hajimiri, La Canada, CA (US)

(73) Assignee: California Institute of Technology, Pasadena, CA (US)

( * ) Notice: Subject to any disclaimer, the term of this patent is extended or adjusted under 35 U.S.C. 154(b) by 203 days.

(21) Appl. No.: 16/042,619

(22) Filed: Jul. 23, 2018

(65) Prior Publication Data

US 2019/0219619 A1 Jul. 18, 2019

Related U.S. Application Data

(60) Provisional application No. 62/535,701, filed on Jul. 21, 2017.

(51) Int. Cl.

| | |
|---|---|
| *G01R 25/00* | (2006.01) |
| *G01R 25/04* | (2006.01) |
| *H02J 50/23* | (2016.01) |
| *H01Q 21/22* | (2006.01) |
| *H01Q 3/26* | (2006.01) |

(52) U.S. Cl.
CPC ............. *G01R 25/04* (2013.01); *H01Q 21/22* (2013.01); *H02J 50/23* (2016.02); *H01Q 3/267* (2013.01)

(58) Field of Classification Search
CPC ........... H02J 50/00; G01R 25/00; H01Q 3/00; H01Q 21/00
See application file for complete search history.

(56) References Cited

U.S. PATENT DOCUMENTS

| | | | | |
|---|---|---|---|---|
| 2010/0315045 | A1* | 12/2010 | Zeine ................... | H02J 50/402 320/137 |
| 2014/0167704 | A1* | 6/2014 | Lafontaine ............. | G01R 25/00 702/66 |
| 2018/0115064 | A1* | 4/2018 | Safavi-Naeini ........ | H01Q 3/267 |

* cited by examiner

*Primary Examiner* — Rexford N Barnie
*Assistant Examiner* — Joseph N Inge
(74) *Attorney, Agent, or Firm* — Weaver Austin Villeneuve & Sampson LLP

(57) ABSTRACT

A method of setting phases of a multitude of transmit elements of a phased array includes, in part, setting a phase of a first transmit element to N different values during each of N different time intervals, transmitting an electromagnetic signal from the first transmit element at each of the N time intervals, measuring a power of the electromagnetic signal at a receiving unit during each of the N time intervals, and selecting coefficients of a basis function such that a difference between a power value computed by the basis function and the measured power value associated with each of the N phases is smaller than a threshold value. The threshold value is optionally defined by a minimum of the sum of squares of the difference between a power value computed by the basis function and the power value for each of the N phases.

21 Claims, 4 Drawing Sheets

PHASED ARRAY WIRELESS POWER DELIVERY OPTMIZATION

CROSS REFERENCE TO RELATED APPLICATIONS

The present application claims benefit under 35 USC 119(e) of Application Ser. No. 62/535,701 filed Jul. 21, 2017, the content of which is incorporated herein by reference in its entirety.

FIELD OF THE INVENTION

The present invention relates to phased array, and more particularly to optimization of power wirelessly delivered using phased arrays.

BACKGROUND OF THE INVENTION

Electrical energy used in powering electronic devices comes predominantly from wired sources. Conventional wireless power transfer relies on magnetic inductive effect between two coils placed in close proximity of one another. To increase its efficiency, the coil size is selected to be less than the wavelength of the radiated electromagnetic wave. The transferred power diminishes strongly as the distance between the source and the charging device is increased.

BRIEF SUMMARY OF THE INVENTION

A method of setting phases of a multitude of transmit elements of a phased array, in accordance with one embodiment of the present invention, includes, in part, setting a phase of a first transmit element to N different values during each of N different time intervals, transmitting an electromagnetic signal from the first transmit element at each of the N time intervals, measuring a power of the electromagnetic signal at a receiving unit during each of the N time intervals, and selecting coefficients of a basis function such that a difference between a power value computed by the basis function and the measured power value associated with each of the N phases is smaller than a threshold value.

In one embodiment, the threshold value is defined by a minimum of the sum of squares of the difference between a power value computed by the basis function and the power value for each of the N phases. In one embodiment, the method further includes, in part, determining a phase of the first transmit element using the selected coefficient and the basis function. In one embodiment, the method further includes, in part, transmitting an electromagnetic signal from the first transmit element in accordance with the determined phase. In one embodiment, the basis function is a periodic basis function.

A method of setting phases of a phased array that includes, in part, K transmit elements, wherein K is an integer, includes, in part, setting phases of M transmit elements to M different values during each of N different time intervals, wherein M an N are integers greater than 2, transmitting electromagnetic signals from the M transmit elements at each of the N time intervals, measuring a power of the electromagnetic signals at a receiving unit during each of the N time intervals, defining a basis function for each of the M transmit elements, and selecting coefficients of each of the basis functions such that a difference between N power values computed by the basis functions and the N measured power values associated with the N×M phases is smaller than a threshold value.

In one embodiment, M is smaller than K. In one embodiment, the threshold value is defined by a minimum of the sum of squares between the N power values computed by the basis functions and the N measured power values associated with the N×M phases. In one embodiment, the method further includes, in part, determining a phase of each of the M transmit elements using the selected coefficients and the basis function associated with the transmit element. In one embodiment, the method further includes, in part, transmitting an electromagnetic signal from each of the M transmit elements in accordance with the phase determined for that transmit element. In one embodiment, each basis function is a periodic basis function.

A phased array, in accordance with one embodiment of the present invention, includes, in part, a multitude of transmit elements and a controller. The controller is configured to: set the phase of a first transmit element to N different phases during each of N different time intervals, cause an electromagnetic signal to be transmitted from the first transmit element at each of the N time intervals, receive a measurement of a power of the electromagnetic signal from a remote receiving unit during each of the N time intervals, and select coefficients of a basis function such that a difference between a power value computed by the basis function and the received power value measurement associated with each of the N phases is smaller than a threshold value.

In one embodiment, the threshold value is defined by a minimum of the sum of squares of the difference between a power value computed by the basis function and the received power value measurement at each of the N phases. In one embodiment, the controller is further configured to determine a phase of the first transmit element using the selected coefficients and the basis function. In one embodiment, the controller is further configured to cause an electromagnetic signal to be transmitted from the first transmit element in accordance with the determined phase.

A phased array, in accordance with one embodiment of the present invention, includes, in part, K transmit elements where K is an integer, and a controller. The controller is configured to: set the phases of M transmit elements to M different phases during each of N different time intervals wherein M an N are integers greater than 2, cause electromagnetic signals to be transmitted from the M transmit elements at each of the N time intervals, receive a measure of power of the electromagnetic signals from a remote receiving unit during each of the N time intervals, and select coefficients of each of M basis functions such that a difference between N power values computed by the M basis functions and the N received power value measurements associated with the N×M phases is smaller than a threshold value.

In one embodiment, M is smaller than said K. In one embodiment, the threshold value is defined by a minimum of the sum of squares between the N power values computed by the basis functions and the N power values measured associated with the N×M phases. In one embodiment, the controller is further configured to determine a phase of each of the M transmit elements using the selected coefficients and the basis function associated with the transmit element. In one embodiment, the controller is further configured to cause transmission of an electromagnetic signal from each of the M transmit elements in accordance with the phase determined for the transmit element.

DETAILED DESCRIPTION OF THE INVENTION

In accordance with one embodiment of the present invention, the phases of a phased array antenna elements are selected so as to maximize the amount of power the array delivers via electromagnetic waves to a remote receiving unit. The phased array determines the optimum phases in accordance with the power values the receiving unit measures and transmits back to the phased array.

Figure 1:
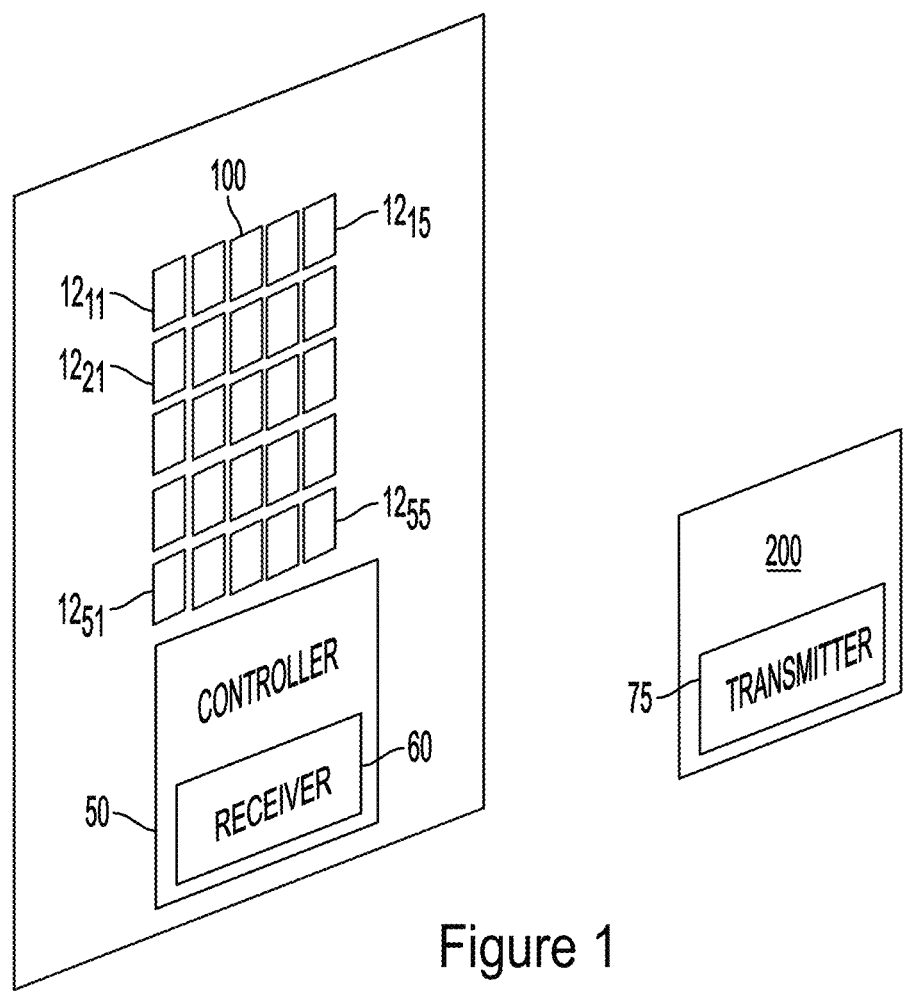
FIG. 1 is a simplified high-level block diagram of a phased array in communications with a receiving unit, in accordance with one embodiment of the present invention.

FIG. 1 shows an exemplary phased array 100 having 25 transmit antenna elements $12_{ij}$ (i and j are indices ranging from 1 to 5 in this example) arranged along two dimensions, and delivering a focused beam of electromagnetic waves to a receiving unit 200. Although phased array 100 is shown as being a two-dimensional array, it is understood that a phased array in accordance with embodiments of the present invention, may be one-dimensional or three-dimensional.

The phase of each antenna element $12_{ij}$ (alternatively referred to herein as element) can be independently controlled, however, an unknown initial static offset exists between phases of the elements. Such offsets result in a coherent speckle pattern when the array is initially powered on thus causing the radiated electromagnetic waves not to be focused on the receiving unit 200. To generate an electromagnetic waves that is focused and targeted on the receiving unit 200, the output phase of each antenna element must be adjusted. Additionally, if the position of the receiving unit 200 changes relative to that of phased array 100, the beam needs to be retargeted, thereby requiring the antenna phases to be changed to optimized power transfer.

The total time required to optimize the phases of the array elements is determined, in part, by the efficiency of the optimization approach, the number of phases that must be tested, and the time required to obtain a power measurement for each potential phase considered.

One technique for maximizing the wireless power transfer from a phased array is by sweeping the phase of each element sequentially. In accordance with this technique, at any given time only one antenna element is selected, while the phases of all remaining elements are held constant. The phase of the selected element is then swept in a series of phase increments over the full range of 0 to 360 degrees of phase, and the power delivered to the receiver is measured and recorded at each step. The recorded data which is a set of points in the form of power versus phase is then scanned to determine the phase value giving rise to the highest power. By iteratively sweeping each element in the array, the phases corresponding to the maximum power are thus determined. Since each element is scanned separately and many power/phase points are measured and recorded, this technique suffers from inefficiency.

Figure 2:
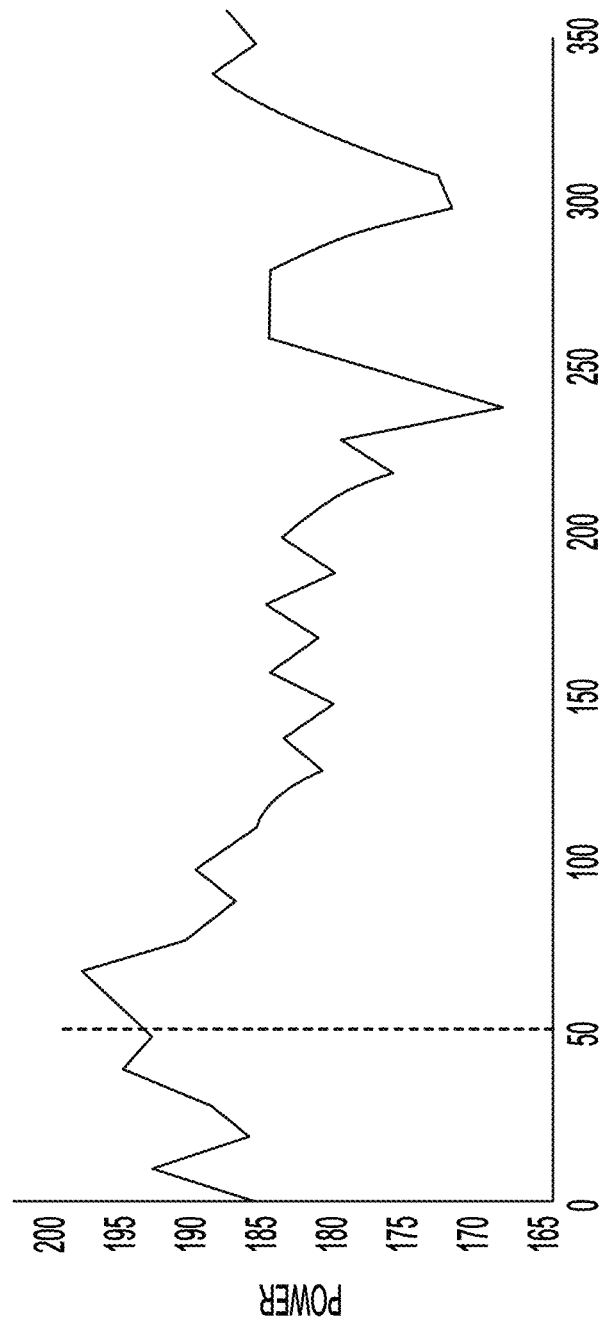
FIG. 2 shows the measured power obtained from sweeping the phase of one element of an exemplary phased array, in accordance with one embodiment of the present invention.

One important consideration in determining the phases is the measurement noise, as described further below. When locating the maximum of a continuous function which is static in time, the choice of an optimization algorithm is determined by the computational efficiency and the likelihood of finding the global maxima of the function. When dealing with a physical system, however, there is a stochastic component that must be accounted for. Measurement noise adds a number of false maxima to the phase optimization function that can result in selecting the wrong phases for the antenna elements. FIG. 2 shows the measured power from sweeping the phase of one element of an exemplary 16-element array in 10 degree increments. This corresponds to a total of 37 measured data points for that single element and 592 data points that must be measured for an entire 16 element array.

From the data in FIG. 2, it is seen that the maximum power transfer is achieved when the phase is selected to be in the range from 50 to about 75 degrees. However, if a phase optimization algorithm starts away from the peak, it will lead to selecting the wrong phase. For example, starting a bracketing algorithm near 250 degrees in phase will find the local maxima near 270 degrees in phase, but will fail to find the global maximum. Similarly, starting a bracketing algorithm near 100 degrees in phase will lock the phase at that point, and again will fail to find the global maximum. Many optimization algorithms that rely on determining the slope of the optimization function (e.g. gradient ascent) will typically overshoot and miss the maxima as well.

In accordance with one embodiment of the present invention, a number of measured power points and phases leading to the measured power points are applied to a basis set of mathematical functions corresponding to the expected transfer function between the phase and measured power values. If the transfer function is unknown, which may occur if the phase assigned to each element in the antenna array has a poor correlation to the realized phase, then, in one embodiment, a basis set of polynomials may be used.

In accordance with another embodiment of the present invention, the power transferred to a receiving unit from each antenna element is described using the following equation:

$$P(\emptyset) = a_0 + \cos\left(\frac{\pi(\emptyset + \varphi)}{180}\right) \quad (1)$$

In equation (1), $a_0$ represents the background power level from other antenna elements, $\emptyset$ represents the phase selected for the antenna element, and $\varphi$ is the static phase offset corresponding to the selected antenna element.

Because $\emptyset$ is known and $\cos(A+B)=\cos(A)\cos(B)-\sin(A)\sin(B)$, equation (1) may be ewritten as:

$$P(\emptyset) = a_0 + a_1 \cos\left(\frac{\pi\emptyset}{180}\right) + a_2 \sin\left(\frac{\pi\emptyset}{180}\right) \quad (2)$$

Equation (2) may alternatively be written as a sum of the following basis functions:

$$P(\emptyset) = a_0 F_0(\emptyset) + a_1 F_1(\emptyset) + a_2 F_2(\emptyset) \quad (3)$$

Comparing equation (2) and (3), it is seen that:

$$F_0(\emptyset) = 1$$
$$F_2(\emptyset) = \cos\left(\frac{\pi\emptyset}{180}\right)$$
$$F_3(\emptyset) = \sin\left(\frac{\pi\emptyset}{180}\right)$$

When N power measurements corresponding to N selected phases are used, the basis set may be defined as the following matrix:

$$A = \begin{bmatrix} F_0(\emptyset_0) & F_1(\emptyset_0) & F_2(\emptyset_0) \\ \vdots & \vdots & \vdots \\ F_0(\emptyset_N) & F_1(\emptyset_N) & F_2(\emptyset_N) \end{bmatrix} \quad (4)$$

The matrix corresponding to the measurement associated with phases $\emptyset_0, \emptyset_1 \ldots \emptyset_N$ selected for each antenna element may be represented as:

$$b = \begin{bmatrix} P_0 \\ \vdots \\ P_n \end{bmatrix} \quad (5)$$

Each of the coefficients $a_0 \ldots a_2$ may be represented by the following coefficient vector:

$$a = \begin{bmatrix} a_0 \\ a_1 \\ a_2 \end{bmatrix} \quad (6)$$

Using (4), (5) and (6), equation (3) may be represented as:

$$A \cdot a = b \quad (7)$$

The above equation (7) may be solved so as to provide the best-fit set of computed coefficients a through a variety of matrix techniques, such as singular value decomposition, and Cholesky decomposition. Using, for example, the linear least squares technique, multiplying both sides of equation (7) by the transpose of matrix A yields:

$$A^T A \cdot a = A^T \cdot b \quad (8)$$

The coefficient vector a may then be obtained by inverting $A^T A$, as shown below:

$$a = (A^T A)^{-1} \cdot A^T \cdot b \quad (9)$$

Figure 3:
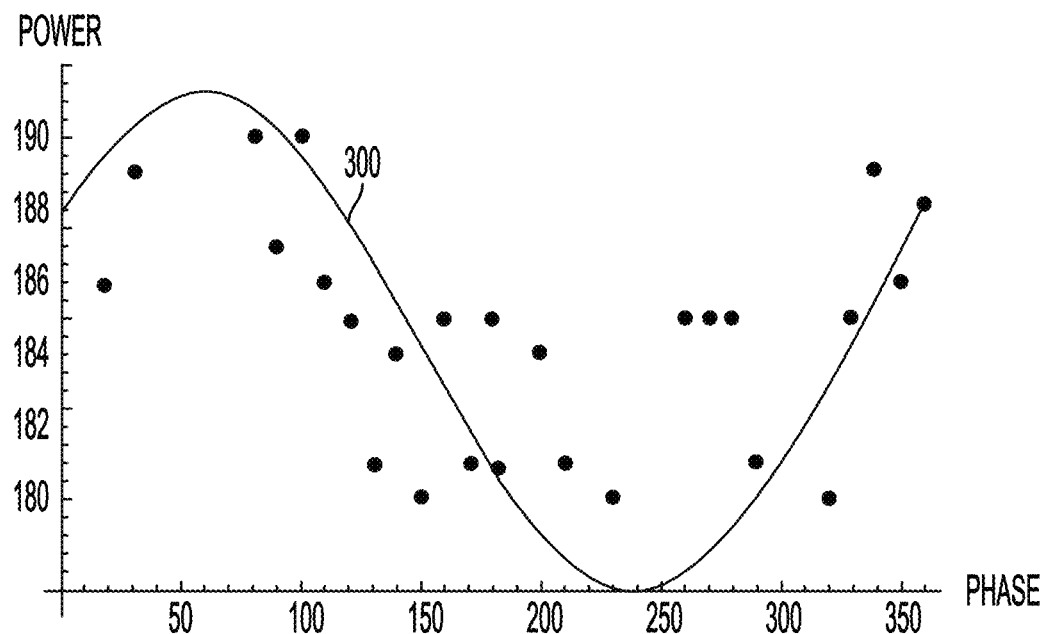
FIG. 3 shows the measured as well as computed power values for a number of phases, in accordance with one embodiment of the present invention.
Figure 4:
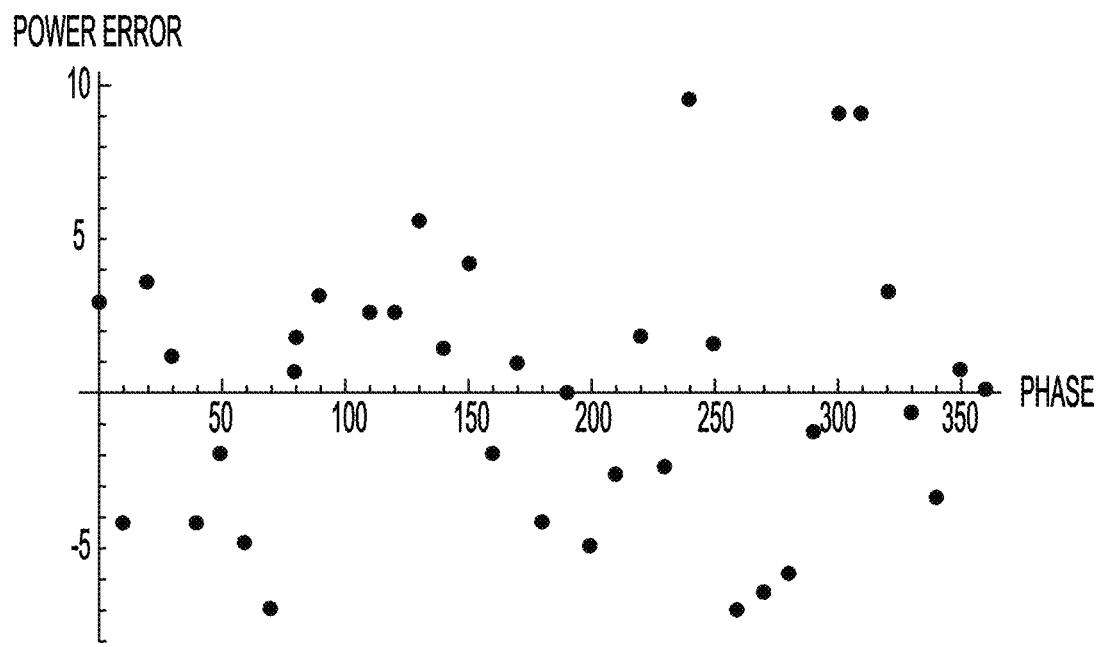
FIG. 4 shows the difference between the measured and computed power values for the phases shown in FIG. 3, in accordance with one embodiment of the present invention.

Equation (9) shows the relationship between the phase and the resulting power associated with each antenna element. FIG. 3 shows the measured power values as well as a plot 300 of the power vs. phase for each antenna element, as determined using equation (9) above. As is seen, the phase value corresponding to the maximum power transfer is 59.3 degrees. FIG. 4 shows the difference between the computed values of the power, as represented by equation (9) and plot 300, and their corresponding measured power values for each of the phases shown.

It is understood that any technique that minimizes the difference between the power values computed using the basis function and the measured power values may be used to determine the coefficients of the basis function. For example, in one embodiment, the coefficients of the basis function are determined such that an output of an error function that calculates a difference between a power value computed by the basis function and the measured power value associated with each of the phases is smaller than a threshold. In another embodiment, the threshold value is defined by a minimum of the sum of squares of the difference between a power value computed by the basis function and the power value for each of the phases.

Figure 5:
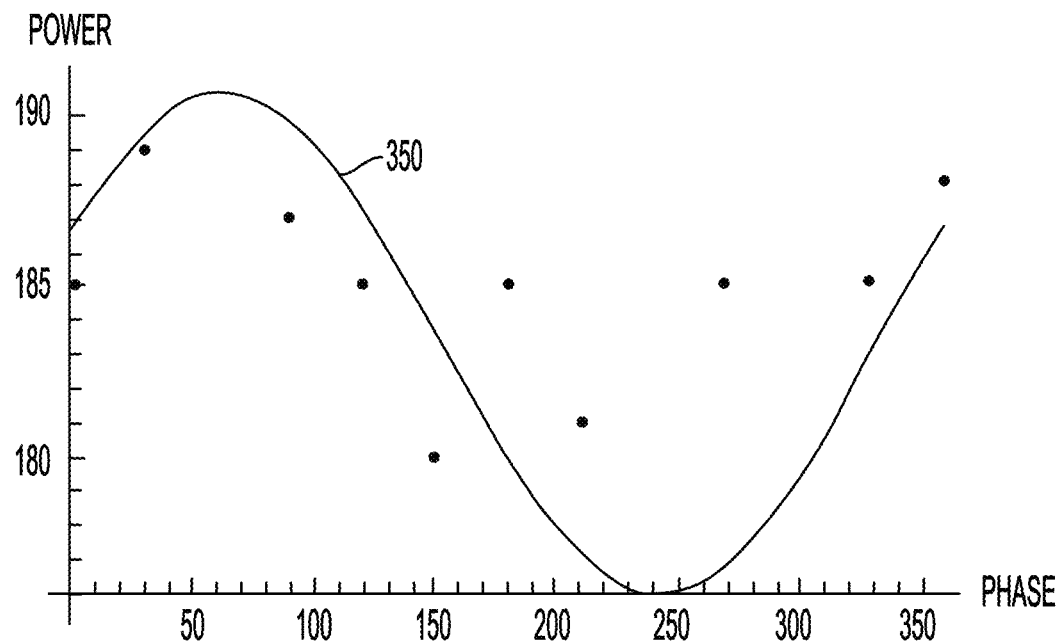
FIG. 5 shows the measured as well as computed power values for a number of phases, in accordance with one embodiment of the present invention.
Figure 6:
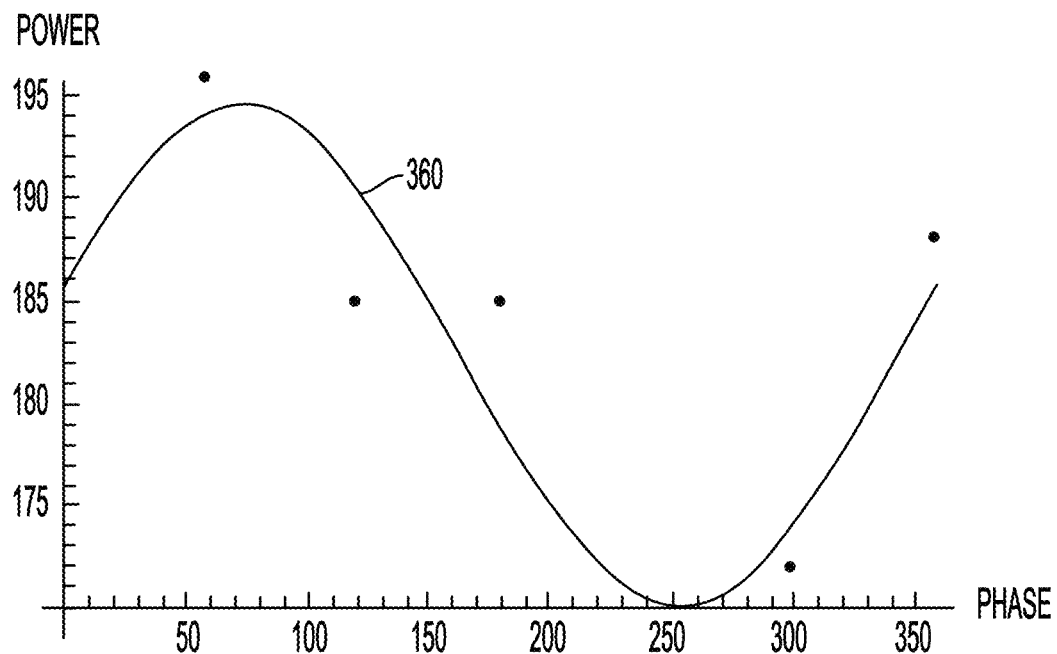
FIG. 6 shows the measured as well as computed power values for a number of phases, in accordance with one embodiment of the present invention.

FIG. 5 shows a plot 350 obtained using every third measured power value and the power's corresponding phase value as shown in FIG. 3. In other words, plot 350 is obtained by using the power values measured at 30 degrees phase increments instead of 10 degrees phase increments used in FIG. 3. FIG. 6 shows a plot 360 obtained using every sixth measured power value and the power's corresponding phase value as shown in FIG. 3. In other words, plot 360 is obtained by using the power values measured at 60 degrees phase increments.

The solution to the equations represented by plots 350 and 360 respectively provide phase values of 62.7 and 74.3 degrees for the maximum power transfer. While they differ, they are close to the optimal phase value of 59.3 degrees obtained using 10 degrees phase increment as shown in plot 300. While plot 300 requires 37 data points, plots 350 and 360 require only 13 and 7 data points, respectively, thus representing a significant decrease in phase optimization time.

In accordance with another embodiment of the present invention, the phases of multiple elements of a phased array are optimize concurrently, using, for example, a least squares technique. Assume that a phased array has m elements. In accordance with such embodiments, the phases of the m elements of the entire array are set to different values to define a first phase vector having m elements. The power transferred by the phased array using the first phase vector is subsequently measured at the receiving unit. The power measurement at the receiving unit is repeated for additional N phase vectors where each phase vector has m elements. The N power measurements for the N phase vectors are thereafter used to compute the coefficients of the basis function, as shown for example in equation (3), for each array elements. Assume that the power transfer function associated with element i of the array with phase $\emptyset_i$ is described as shown below:

$$P_i(\emptyset_i) = a_{0i} F_0(\emptyset_i) + a_{1i} F_1(\emptyset_i) + a_{2i} F_2(\emptyset_i) \quad (10)$$

Assume further that the power delivered by the phased array is the sum of the power delivered by the individual array elements. Accordingly, the power transfer function for a group of m antenna elements, for the $j^{th}$ phase vector defined by phases $\emptyset_{0j} \ldots \emptyset_{mj}$ may be expressed as shown below:

$$P_j(\emptyset_{0j} \ldots \emptyset_{mj}) = \Sigma_{i=0}^m P_i(\emptyset_{ij}) = \Sigma_{i=0}^m a_{0i} F_0(\emptyset_{ij}) + a_{1i} F_1(\emptyset_{ij}) + a_{2i} F_0(\emptyset_{ij}) \quad (11)$$

In equation (11), $\emptyset_{ij}$ represents the phase of the antenna element i used in phase vector j. Since $F_0(\emptyset_{ij})$ is equal to 1, as shown above, equation (11) may be simplified to the following:

$$P_j(\emptyset_{0j} \ldots \emptyset_{mj}) = a_0 + \Sigma_{i=0}^m a_{1i} F_1(\emptyset_{ij}) + a_{2i} F_0(\emptyset_{ij}) \quad (12)$$

The basis set associated with equation (12) may thus be defined by the following matrix:

$$A = \begin{bmatrix} 1 & F_1(\emptyset_{00}) & F_2(\emptyset_{00}) & \ldots & F_1(\emptyset_{m0}) & F_2(\emptyset_{m0}) \\ \vdots & \vdots & & & \vdots & \\ 1 & F_2(\emptyset_{0n}) & F_2(\emptyset_{00}) & \ldots & F_1(\emptyset_{m0}) & F_2(\emptyset_{m0}) \end{bmatrix} \quad (13)$$

Matrix 13 has (2m+1) column and n rows defining n unique phase vectors, where n>(2m+1). Coefficients of the vector a of the basis function may then be computed using the following expression:

$$a = (A^T A)^{-1} \cdot A^T \cdot b \quad (14)$$

where b is the vector representing measured power values.

In yet other embodiments, the phased array may be divided into a number of subarrays. The power measurement is then carried out in accordance with a number of phase vectors associated with each subarray thereby to enable the determination of the basis coefficients for the subarray elements. A similar process is then repeated for all the other subarrays until the coefficients of the basis function associated with each element of each subarray is computed, as described above.

In the presence of coupling between the antenna phases, the optimization problem becomes nonlinear. However, using the sequential optimization of subarrays, as described above, mitigates the coupling effect. When a subarray of antenna phases is optimized with the state of the rest of the array held static, the coupling from the rest of the array is taken into account when solving the above equations. Assuming that antenna coupling is weak enough that the optimization space remains convex, by iteratively performing optimization across all subarrays within the array, the entire array is optimized in sequence. While slower than determining the coefficients of the basis functions for the entire array, dividing the array into a subarray is faster and is more immune to noise than element-by-element optimization.

The phase vectors used to determine the coefficients of the basis functions (multi-dimensional solution) are selected so as to ensure the generation of linearly independent measurements. Otherwise, the matrix $A^T A$ can become singular in which case the basis function coefficients cannot be computed. To achieve a high probability that the matrix $A^T A$ is nonsingular, white noise may be used in generating the phase vectors for the measurement.

For a phased array with m elements and n power measurements, a phase generation vector of length m+n in which each vector element is a randomly generated noise bounded by phase limits (0-360) is used. To generate a phase vector for a measurement, in accordance with one technique, a range of length m is sequentially selected from the phase generation vector and assigned to the phases. Assuming the adequacy of the level of randomness in the noise, each resulting phase vector will be sufficiently decoupled from the others to prevent a singular matrix. The technique of generating a single lookup table from which to derive phase vectors is more computationally efficient than using a pseudorandom number generator for each test phase.

In one embodiment, as shown in FIG. 1, in one embodiment, the phased array includes a controller 50 configured to receive the power measurements from the receiving unit 200 via a wireless link established between the phased array and the receiving unit. Such a wireless link may be established between receiver 60 disposed in controller 50 and transmitter 75 disposed in receiving unit 200.

In one embodiment, controller 50 is configured to select the phases of the elements of phased array 100, cause the transmit elements to transmit electromagnetic signals using the selected phases, receive power measurements from the receiving unit 200, and compute the coefficients of the basis functions from the power measurements and selected phases in accordance with any of the embodiments described above. Controller 50 may be further configured to set the phases of the transmit elements to the values obtained from the computed basis function coefficients and cause the transmit elements to transmit electromagnetic signals using the set phases.

The above embodiments of the present invention are illustrative and not limitative. The embodiments of the present invention are not limited by the number of transmitting elements of the phased array. The above embodiments of the present invention are not limited by the wavelength or frequency of the signal. Other modifications and variations will be apparent to those skilled in the art and are intended to fall within the scope of the appended claims.

What is claimed is:

1. A method of setting phases of a plurality of transmit elements of a phased array, the method comprising:
    setting a phase of a first transmit element to N different values during each of N different time intervals, wherein N is an integer greater than one;
    transmitting an electromagnetic signal from the first transmit element at each of the N time intervals;
    measuring a power of the electromagnetic signal at a receiving unit during each of the N time intervals;
    applying the measured powers to a basis function; and
    selecting coefficients of the basis function such that a difference between a power value computed by the basis function and the measured power value associated with each of the N phases is smaller than a threshold value, wherein a measured power of the electromagnetic signal transmitted by the first transmit element is defined by the phase Ø of the first transmit element, and a static phase offset φ of the first transmit element.

2. The method of claim 1 wherein said threshold value is defined by a minimum of the sum of squares of the difference between a power value computed by the basis function and the power value for each of the N phases.

3. The method of claim 2 further comprising:
    determining a phase of the first transmit element using the selected coefficient and the basis function.

4. The method of claim 3 further comprising:
    transmitting an electromagnetic signal from the first transmit element in accordance with the determined phase.

5. The method of claim 2 wherein said basis function is a periodic basis function.

6. A method of setting phases of a phased array comprising K transmit elements, wherein K is an integer, the method comprising:
    setting phases of M transmit elements to M different values during each of N different time intervals, wherein M and N are integers greater than 2;
    transmitting electromagnetic signals from the M transmit elements at each of the N time intervals;
    measuring a power of the electromagnetic signals at a receiving unit during each of the N time intervals;
    applying the measured powers to a basis function for each of the M transmit elements; and
    selecting coefficients of each of the basis functions such that a difference between N power values computed by the basis functions and the N measured power values associated with the N×M phases is smaller than a threshold value, wherein a measured power of the electromagnetic signal transmitted by a first one of the M transmit elements is defined by a phase Ø of the first transmit element, and a static phase offset φ of the first transmit element.

7. The method of claim 6 wherein said M is smaller than said K.

8. The method of claim 6 wherein said threshold value is defined by a minimum of the sum of squares between the N power values computed by the basis functions and the N measured power values associated with the N×M phases.

9. The method of claim 6 further comprising:
determining a phase of each of the M transmit elements using the selected coefficients and the basis function associated with the transmit element.

10. The method of claim 9 further comprising:
transmitting an electromagnetic signal from each of the M transmit elements in accordance with the phase determined for the transmit element.

11. The method of claim 9 wherein each said basis function is a periodic basis function.

12. A phased array comprising a plurality of transmit elements and a controller configured to:
set a phase of a first transmit element to N different phases during each of N different time intervals;
cause an electromagnetic signal to be transmitted from the first transmit element at each of the N time intervals;
receive a measurement of a power of the electromagnetic signal from a remote receiving unit during each of the N time intervals;
applying the measured powers to a basis function; and
select coefficients of the basis function such that a difference between a power value computed by the basis function and the received power value measurement associated with each of the N phases is smaller than a threshold value wherein a measured power of the electromagnetic signal transmitted by the first transmit element is defined by the phase Ø of the first transmit element, and a static phase offset φ of the first transmit element.

13. The phased array of claim 12 wherein said threshold value is defined by a minimum of the sum of squares of the difference between a power value computed by the basis function and the received power value measurement at each of the N phases.

14. The phased array of claim 13 wherein said controller is further configured to:
determine a phase of the first transmit element using the selected coefficients and the basis function.

15. The phased array of claim 13 wherein said controller is further configured to:
cause an electromagnetic signal to be transmitted from the first transmit element in accordance with the determined phase.

16. A phased array comprising K transmit elements, K being an integer, and a controller configured to:
set phases of M transmit elements to M different phases during each of N different time intervals, wherein M an N are integers greater than 2;
cause electromagnetic signals to be transmitted from the M transmit elements at each of the N time intervals;
receive a measure of power of the electromagnetic signals from a remote receiving unit during each of the N time intervals;
applying the measured powers to a basis function for each of the M transmit elements; and
select coefficients of each of M basis functions such that a difference between N power values computed by the M basis functions and the N received power value measurements associated with the N×M phases is smaller than a threshold value, wherein a measured power of the electromagnetic signal transmitted by a first one of the M transmit elements is defined by a phase Ø of the first transmit element, and a static phase offset φ of the first transmit element.

17. The phased array of claim 16 wherein said M is smaller than said K.

18. The phased array of claim 16 wherein said threshold value is defined by a minimum of the sum of squares between N power values computed by the basis functions and N power values measured associated with the N×M phases.

19. The phased array of claim 16 wherein said controller is further configured to:
determine a phase of each of the M transmit elements using the selected coefficients and the basis function associated with the transmit element.

20. The phased array of claim 17 wherein said controller is further configured to:
cause transmission of an electromagnetic signal from each of the M transmit elements in accordance with the phase determined for the transmit element.

21. The method of claim 1 wherein the power of the electromagnetic signal transmitted by the first transmit element to the receiving unit is defined as:

$$P(\emptyset) = a_0 + \cos\left(\frac{\pi(\emptyset + \varphi)}{180}\right)$$

wherein $a_0$ represents the background power level from other antenna elements, Ø represents the phase of the first transmit element, and φ is the static phase offset corresponding to the first transmit element.

* * * * *